US008926379B2

(12) United States Patent
Vinther

(10) Patent No.: US 8,926,379 B2
(45) Date of Patent: Jan. 6, 2015

(54) COMPLIANT ELECTRICAL CONTACT

(75) Inventor: Gordon A Vinther, Hampton Beach, NH (US)

(73) Assignee: Ardent Concepts, Inc., Seabrook, NH (US)

( * ) Notice: Subject to any disclaimer, the term of this patent is extended or adjusted under 35 U.S.C. 154(b) by 31 days.

(21) Appl. No.: 13/990,619

(22) PCT Filed: Dec. 2, 2011

(86) PCT No.: PCT/US2011/062993
§ 371 (c)(1),
(2), (4) Date: Jun. 20, 2013

(87) PCT Pub. No.: WO2012/075356
PCT Pub. Date: Jun. 7, 2012

(65) Prior Publication Data
US 2014/0065893 A1    Mar. 6, 2014

Related U.S. Application Data

(60) Provisional application No. 61/419,414, filed on Dec. 3, 2010, provisional application No. 61/423,064, filed on Dec. 14, 2010, provisional application No. 61/430,612, filed on Jan. 7, 2011.

(51) Int. Cl.
*H01R 4/48* (2006.01)
*G01R 1/067* (2006.01)

(52) U.S. Cl.
CPC .............. *H01R 4/48* (2013.01); *G01R 1/06722* (2013.01)
USPC .......................................................... 439/817

(58) Field of Classification Search
USPC ............. 439/817, 65, 66, 482, 700, 824, 287, 439/862
See application file for complete search history.

(56) References Cited

U.S. PATENT DOCUMENTS 4,161,346 A    7/1979    Cherian et al.
4,199,209 A    4/1980    Cherian et al.
(Continued)

FOREIGN PATENT DOCUMENTS

JP    2005-345235 A    12/2005
KR   2009-0067572 A    6/2009
WO   92/08258 A1       5/1992

OTHER PUBLICATIONS
International Search Report and Written Opinion of the International Searching Authority for PCT Application No. PCT/US2008/081578, dated Dec. 19, 2008.

*Primary Examiner* — Jean F Duverne
(74) *Attorney, Agent, or Firm* — Altman & Martin; Steven K. Martin

(57) ABSTRACT

A compliant electrical contact (10) and an assembly (12) employing a plurality of the contacts (10). The contact (10) has several embodiments, all of which include a spring (20) with convolutions (22), a contact point (24) at each end, and a shunt (50) that is generally parallel to the spring (20) and that spans the convolutions (22) longitudinally. In one embodiment, one end of a single shunt strip (90) is fixedly attached near a contact point (24a) and the other end is slidably attached near the other contact point (24b). In another embodiment, the center of a single shunt strip (92) is fixedly attached at the center of the spring (20) and the two ends are slidably attached near the contact points (24). In another embodiment, one end of one shunt strip (94) is fixedly attached near one contact point (24a), one end of another shunt strip (96) is fixedly attached near the other contact point (24b). In one configuration, the other ends (104) of the shunt strips (94, 96) are slidably attached to the center of the spring (20). In other configurations, the other ends of the shunt strips (94, 96) are slidably electrically connected to each other. In the assembly (12), the contact (10) is placed within a through aperture (32) in a dielectric panel (30) with the contact points (24) protruding through openings (34). Optionally, the aperture (32) is filled with a compliant, electrically conductive elastomer (36) after the contact (10) is installed.

20 Claims, 15 Drawing Sheets

(56) References Cited

U.S. PATENT DOCUMENTS

| | | |
|---|---|---|
| 4,773,877 A | 9/1988 | Krüger et al. |
| 5,667,410 A | 9/1997 | Johnston |
| 5,865,641 A | 2/1999 | Swart et al. |
| 7,556,503 B2 | 7/2009 | Vinther |
| 7,731,546 B2 * | 6/2010 | Grube et al. .................. 439/700 |
| 7,772,864 B2 * | 8/2010 | Nagata .................... 324/754.03 |
| 7,866,986 B2 * | 1/2011 | Rikimaru et al. ................ 439/65 |
| 7,942,677 B2 * | 5/2011 | Rikimaru et al. ................ 439/66 |
| 8,098,078 B1 * | 1/2012 | Campbell ................ 324/754.11 |
| 8,506,307 B2 * | 8/2013 | Henry et al. .................... 439/66 |
| 2002/0142669 A1 | 10/2002 | Phillips |
| 2005/0184748 A1 | 8/2005 | Chen et al. |
| 2008/0036484 A1 * | 2/2008 | Lee ............................... 324/761 |
| 2010/0207654 A1 | 8/2010 | Hsu |

* cited by examiner

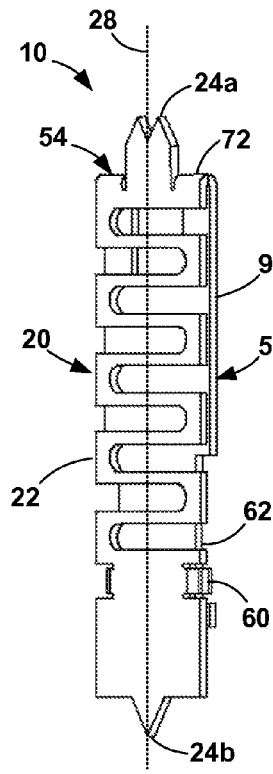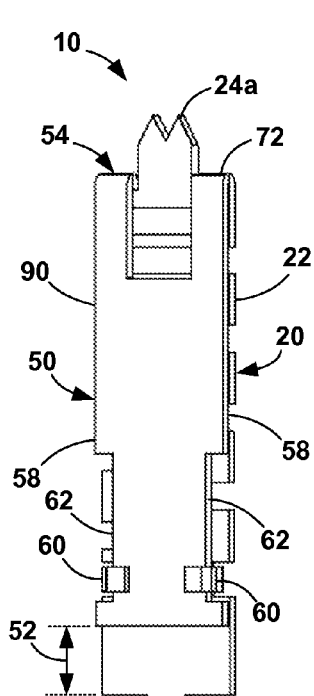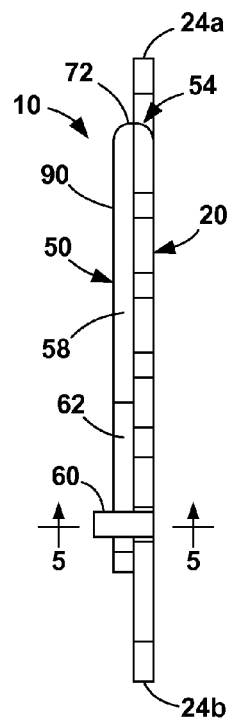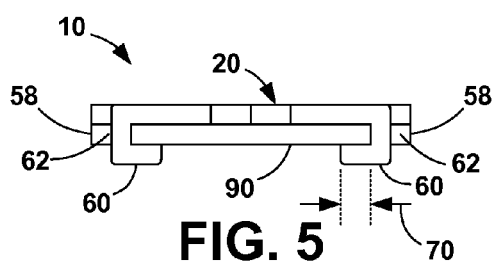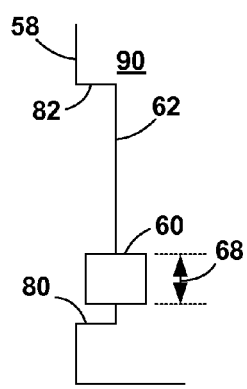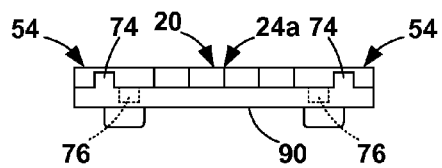

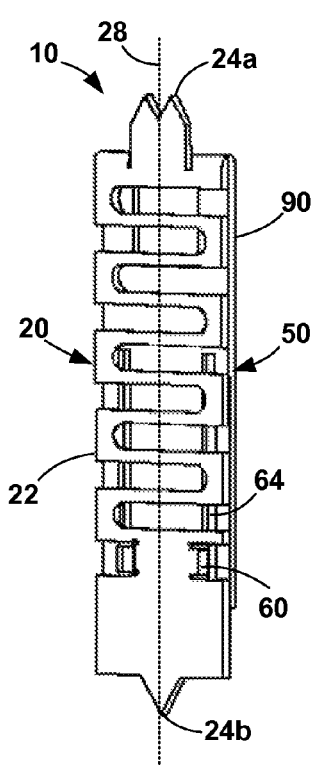
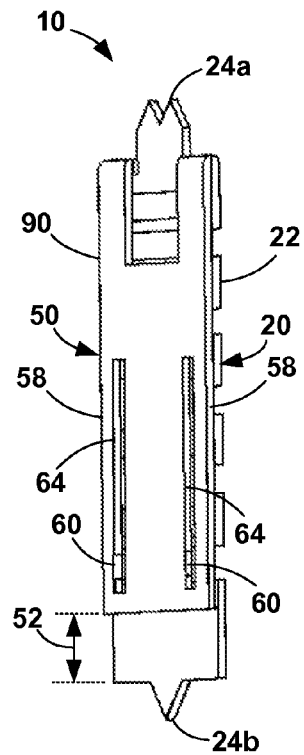
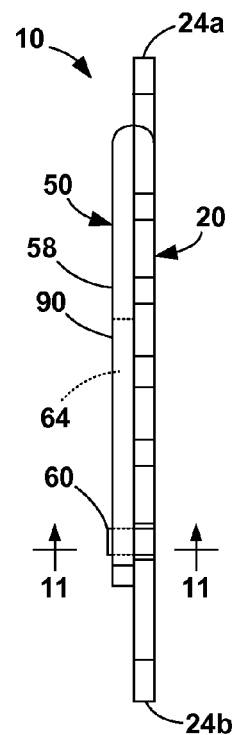
FIG. 8    FIG. 9    FIG. 10
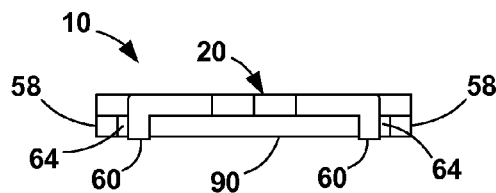
FIG. 11
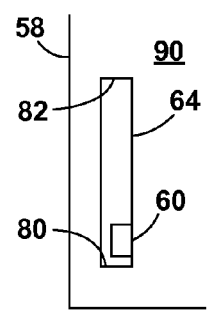
FIG. 12

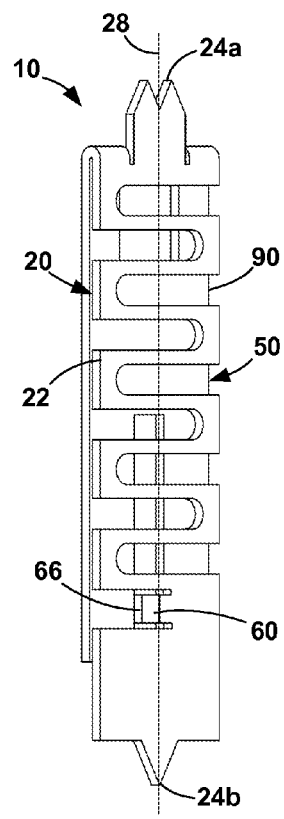 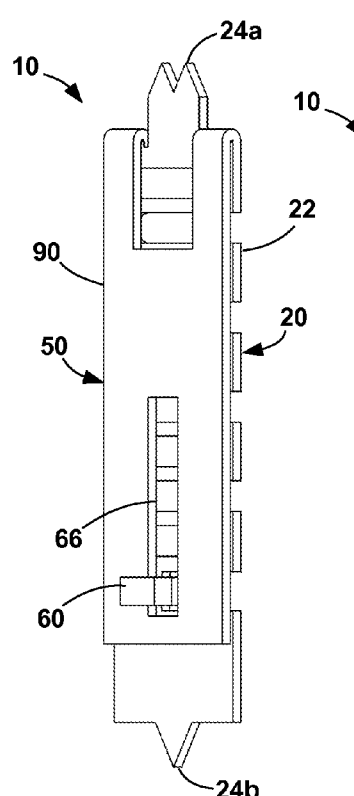 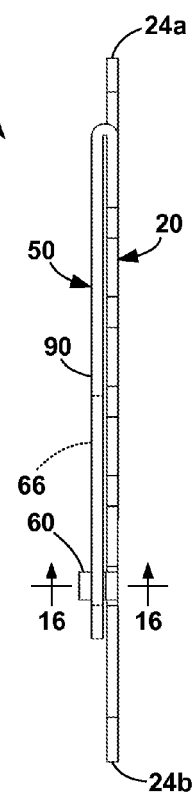
FIG. 13     FIG. 14     FIG. 15
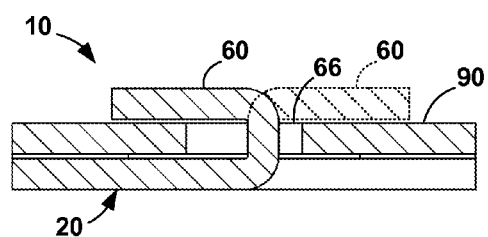
FIG. 16

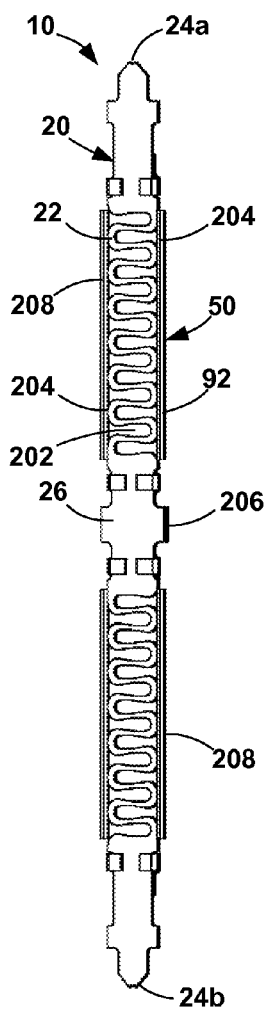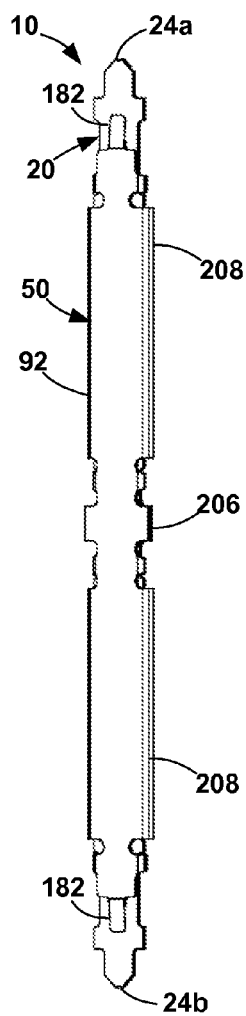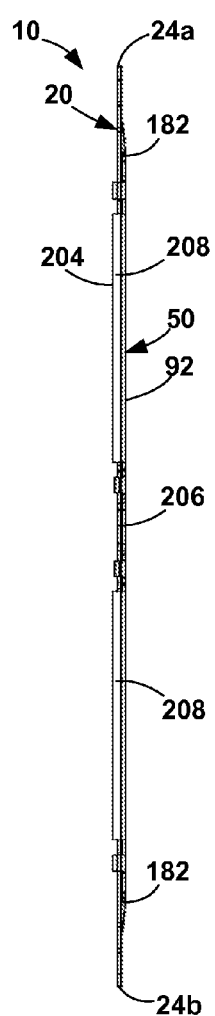
FIG. 21    FIG. 22    FIG. 23
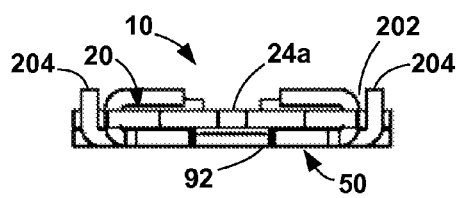
FIG. 24

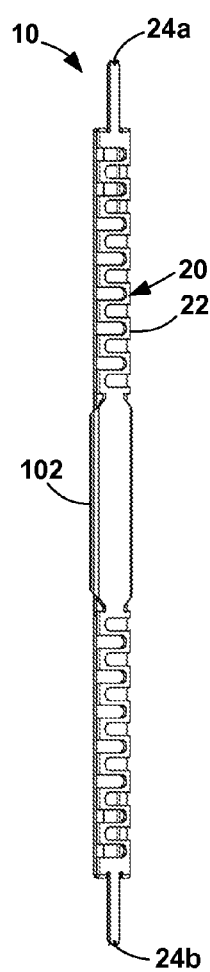
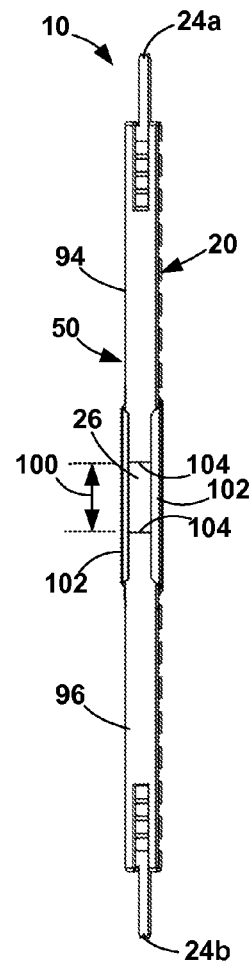
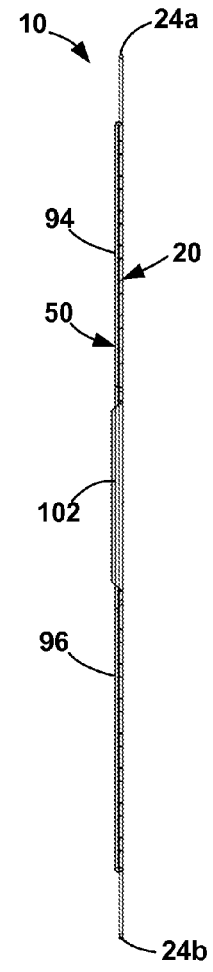
FIG. 29    FIG. 30    FIG. 31
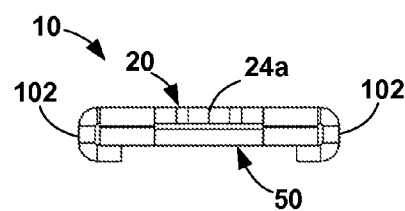
FIG. 32

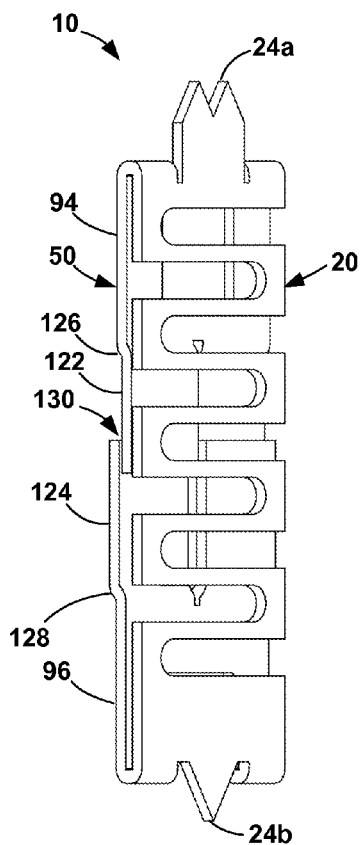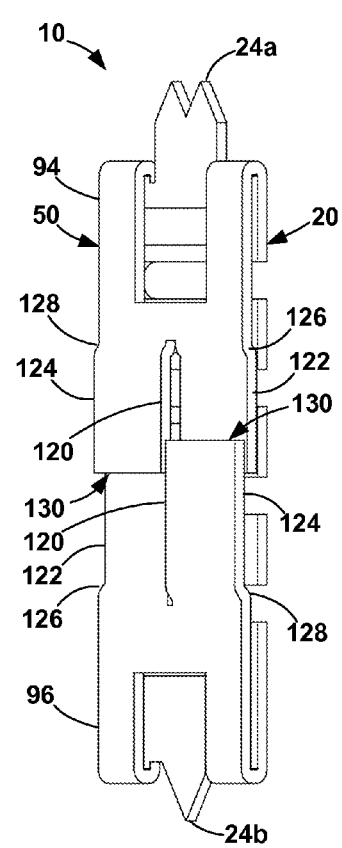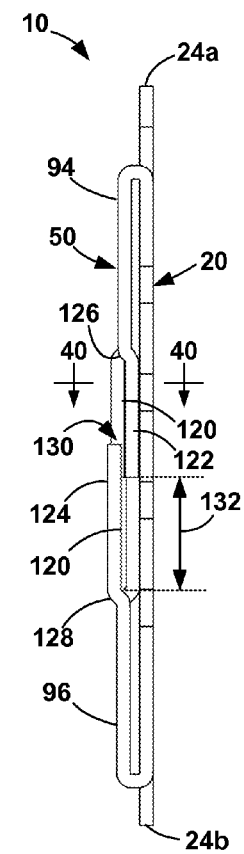
FIG. 37    FIG. 38    FIG. 39
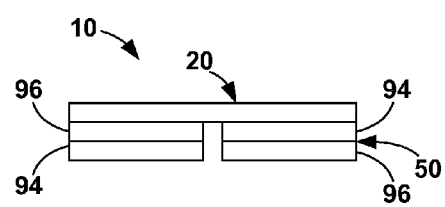
FIG. 40

COMPLIANT ELECTRICAL CONTACT

BACKGROUND OF THE INVENTION

1. Field of the Invention

The present invention relates to electrical contacts, more particularly, to very small compliant electrical contacts with low inductance at high frequencies.

2. The Prior Art

The purpose of an electrical contact is to provide a separable electrical interconnection between two electrical conductors. The characteristic of separability means that the conductors are not interconnected by permanent mechanical means, such as soldering or bonding, but by temporary mechanical means. Consequently, in order to maintain a good mechanical contact in an attempt to minimize detrimental electrical effects of the contact, some form of spring force is used to press the two conductors together. These electrical contacts are called compliant (as in "flexible") contacts.

Small compliant contacts are necessary for separably interconnecting integrated circuit (IC) devices to whatever electrical device the user desires. A prime example is connecting the IC to a test fixture or sorting equipment used for testing and sorting IC's during manufacture or an Original Equipment Manufacturer (OEM) type connector for connecting an IC to its operating environment such as a CPU in a personal computer, file server or mainframe computer. The compliant contact should be as close to electrically transparent as possible in order to minimize parasitic effects, such as inductance, that alter the signals to and from the IC which could lead to erroneous results.

Compliant contacts provide another advantage in that they can compensate for noncoplanarities of the devices (UUT's) being connected. The conduction points on the UUT's are not exactly coplanar, that is, they are not within the same plane, even between the same conduction point on different UUT's. The compliant contacts deflect by different amounts depending upon the actual position of the conduction point.

Conventional compliant contacts for connecting to UUT's include spring probes, conductive rubber, compliant beam contacts, and bunched up wire called fuzz buttons. Each technology provides the necessary means to overcome the noncoplanarities between the contact points and provides uniform electrical contact throughout a plurality of contacts. Each technology has shortcomings in one characteristic or another and all have high electrical parasitic characteristics. In addition, they are relatively expensive to manufacture.

A typical spring probe consists of at least three or four parts, a hollow barrel with a spring and one or two plungers. The spring is housed in the barrel with the end of the plungers crimped in opposed open ends of the barrel at the ends of the spring. The spring biases the plungers outwardly, thereby providing a spring force to the tip of the plungers. Spring probes can have highly varying degrees of compliance and contact force, and are generally very reliable for making contact many times or for many cycles. Spring probes can accommodate many different conduction interfaces, such as pads, columns, balls, etc. Spring probes, however, have a size problem in that the spring itself cannot be made very small, otherwise consistent spring force from contact to contact cannot be maintained. Thus, spring probes are relatively large, leading to an unacceptably large inductance when used for electrical signals at higher frequencies. Additionally, spring probes are relatively costly since the three components must be manufactured separately and then assembled.

Conductive rubber contacts are made of rubber and silicones of varying types with embedded conductive metal elements. These contact solutions usually are less inductive than spring probes, but have less compliance and are capable of fewer duty cycles than spring probes. The conductive rubber works when the conduction point is elevated off the UUT thus requiring a protruding feature from the UUT or the addition of a third conductive element to the system to act as a protruding member. This third member lessens the contact area for a given contact force and thus increases the force per unit area so that consistent contact can be made. The third element may be a screw machined button which rests on the rubber between the conduction point. This third element can only add inductance to the contact system.

Compliant beam contacts are made of a conductive material formed such that deflection and contact force is attained at one end to the UUT conduction point while the other end remains fixed to the other conductor. In other words, the force is provided by one or more electrically conductive leaf springs. These contacts vary greatly in shape and application. Some compliant beam contacts are small enough to be used effectively with IC's. Some compliant beam contacts use another compliant material, such as rubber, to add to the compliance or contact force to the beam contact point. These later types tend to be smaller than traditional compliant beam contacts and thus have less inductance and are better suited for sorting higher frequency devices.

Fuzz buttons are a relatively old yet simple technology in which a wire is crumpled into a cylindrical shape. The resulting shape looks very much like tiny cylinder made of steel wool. When the cylinder is placed within a hole in a sheet of nonconductive material, it acts like a spring that is continuously electrically shorted. It provides a less inductive electrical path than other contact technologies. Like rubber contacts, the fuzz button is most commonly used with a third element needed to reach inside the hole of the nonconductive sheet to make contact with the fuzz button. This third element increases parasitic inductance, degrading the signals to and from the UUT.

IC packaging technology is evolving toward being smaller, higher frequency (faster), and cheaper, resulting in new requirements for these types of electrical contacts. They need to perform adequately at the lowest cost. One problem with forming electrical connecting elements for such packages is that the dimensions of the contacts are extremely small. As a result, resistance, capacitance, and inductance values are so high as to be almost unacceptable.

SUMMARY OF THE INVENTION

The present invention is a compliant electrical contact and an assembly employing a plurality of the contacts. The contact has several embodiments, all of which include a spring with convolutions, a contact point at each end, and a shunt that is generally parallel to the spring and that spans the convolutions longitudinally.

The shunt has three basic embodiments: a single shunt strip attached near a contact point, a single shunt strip attached at the center of the spring, and two shunt strips attached near the contact points.

For the single shunt strip embodiment with the shunt strip attached near one contact point, the present invention contemplates any manner of attachment of the shunt strip and the spring. In one, the contact is stamped as a single piece and bent 180° near the contact point. In another, the shunt strip and spring are stamped as two separate components with abutting, interlocking projections that are later attached together.

A pair of protrusions extend from the spring or shunt strip. The protrusions can be any form that extends from the plane of the spring or shunt strip. A non-exhaustive list includes a 90° bend in the edge, a 180° hook in the edge, and a bend or hook stamped from the interior and bent in either direction. The protrusions provide a sliding electrical contact between the shunt strip and the spring. Hook protrusions hold the shunt strip against the spring to make sure of electrical contact.

There are three configurations. In one, the protrusions bend around longitudinal, elongated, parallel open slots in the edge of the shunt or spring. In the second, the protrusions extend through longitudinal, elongated, parallel slots near the outer edges. In the third, the protrusion extends through a single longitudinal, elongated slot at or near the center. The length of the slots can be used to determine preloading and to limit maximum compression.

The second embodiment employs a single shunt strip attached at the center of the spring. The spring, rather than having continuous convolutions, has a break in the center. Any method of attachment of the shunt strip to the break in the spring.

Each end of the shunt strip provides a sliding attachment to the spring employing the same types of sliding contact configurations as the single shunt strip attached near a contact point embodiment.

Alternatively, the side edges of the shunt are bent longitudinally to form a U-shaped channel for the spring. Alternatively, the edges are bent completely around the spring section.

The third embodiment of the contact employs two shunt strips in a number of different configurations. One shunt strip is attached at one contact point and the other shunt strip is attached at the other contact point.

In the first configuration, the spring has a break in the center and the two shunt strips extend toward each other, leaving a gap between them. The sides of the spring extend around the shunt strips to provide a sliding electrical contact.

In the second configuration, the two shunt strips overlap. The end section of one shunt strip has an S bend that overlaps the other shunt strip to provide a sliding electrical contact.

In the third configuration, the two shunt strips are split longitudinally. One split section has an S bend inwardly toward the spring and the other split section has an S bend outwardly away from the spring. Opposite inward and outward sections to provide a sliding electrical contact.

In the fourth configuration, the end section of each shunt strip has a width less than half the contact width. 90° tabs overlay the other end section to provide a sliding electrical contact.

In the fifth configuration, the two shunt strips overlap. One shunt strip has a longitudinal slot and the other shunt strip has a 90° protrusion that extends into the slot to provide a sliding electrical contact.

The contact is used in an assembly that provides temporary electrical connections to conduction points between the two electrical devices. In general, the contact is placed within a through aperture in a dielectric panel. The bulk of the contact resides in a cavity in the aperture and the contact points protrude through openings. Optionally, the aperture is filled with a compliant, electrically conductive elastomer after the contact is installed. The contacts can be oriented at right angles to each other, all in the same direction, or any orientation relative to each other.

Objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein:

FIG. 2 is a front isometric view of a configuration of the single shunt strip embodiment of the contact of the present invention;

FIG. 3 is a back isometric view of the contact of FIG. 2;

FIG. 4 is a side view of the contact of FIG. 2;

FIG. 5 is a cross-sectional view of the contact of FIG. 4 taken at the line 5-5;

FIG. 6 is a detail of the shunt hook notch of the contact of FIG. 2;

FIG. 7 is a top view of an alternative attachment between the spring and shunt;

FIG. 8 is a front isometric view of another configuration of the single shunt strip embodiment of the contact of the present invention;

FIG. 9 is a back isometric of the contact of FIG. 8;

FIG. 10 is a side view of the contact of FIG. 8;

FIG. 11 is a cross-sectional view of the contact of FIG. 10 taken at the line 11-11;

FIG. 12 is a detail of the shunt hook slot of the contact of FIG. 8;

FIG. 13 is a front isometric view of another configuration of the single shunt strip embodiment of the contact of the present invention;

FIG. 14 is a back isometric of the contact of FIG. 13;

FIG. 15 is a side view of the contact of FIG. 13;

FIG. 16 is a cross-sectional view of the contact of FIG. 15 taken at the line 16-16;

FIG. 21 is a front isometric view of another configuration of the single shunt strip double-ended embodiment of the contact of the present invention;

FIG. 22 is a back isometric of the contact of FIG. 21;

FIG. 23 is a side view of the contact of FIG. 21;

FIG. 24 is a top view of the contact of FIG. 21;

FIG. 29 is a front isometric view of a configuration of the double shunt strip embodiment of the contact of the present invention;

FIG. 30 is a back isometric of the contact of FIG. 29;

FIG. 31 is a side view of the contact of FIG. 29;

FIG. 32 is a top view of the contact of FIG. 29;

FIG. 37 is a front isometric view of another configuration of the double shunt strip embodiment of the contact of the present invention;

FIG. 38 is a back isometric of the contact of FIG. 37;

FIG. 39 is a side view of the contact of FIG. 37;

FIG. 40 is a cross-sectional view of the contact of FIG. 39 taken along the line 40-40;

DETAILED DESCRIPTION OF THE INVENTION

Figure 1:
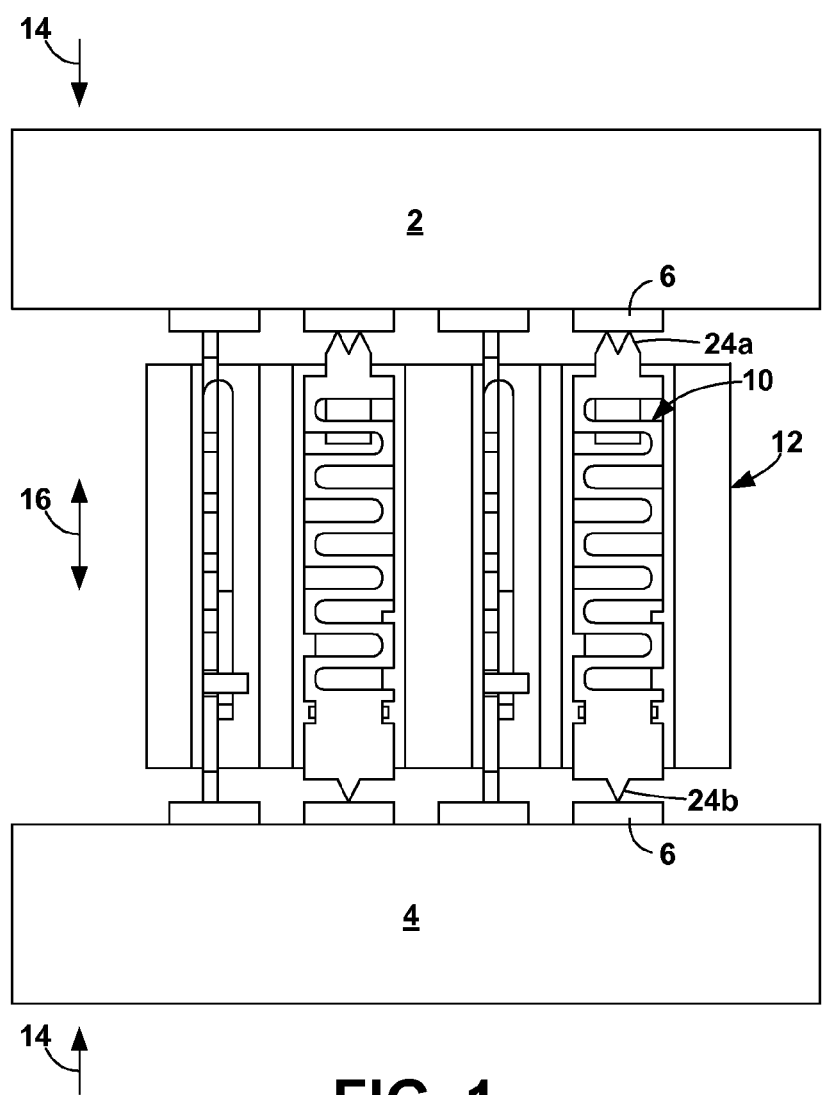
FIG. 1 is a side, cross-sectional view of an assembly of the present invention between two electrical devices.
Figure 17:
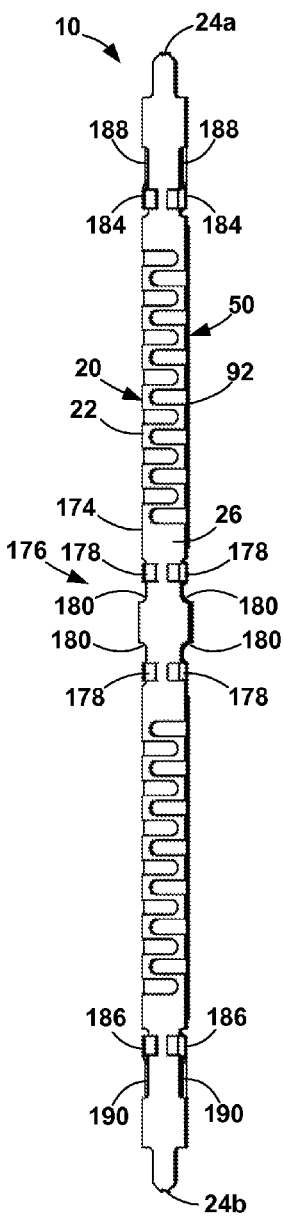
FIG. 17 is a front isometric view of the single shunt strip double-ended embodiment of the contact of the present invention.
Figure 18:
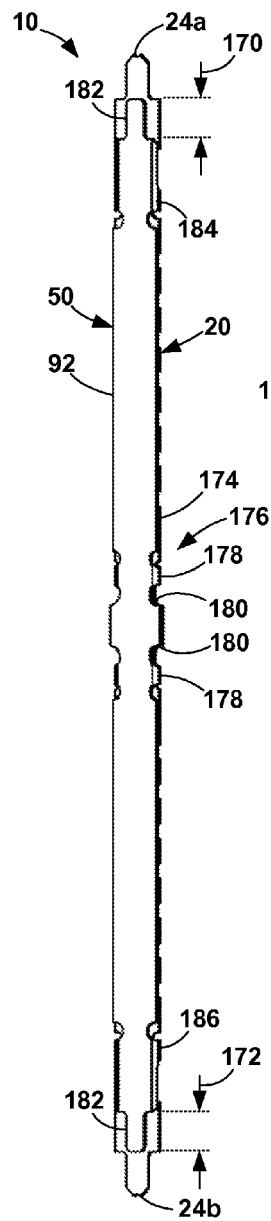
FIG. 18 is a back isometric of the contact of FIG. 17.
Figure 19:
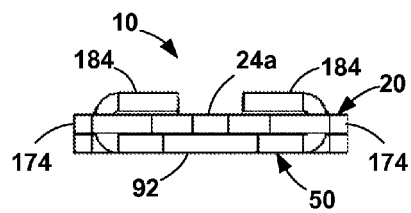
FIG. 19 is a top view of the contact of FIG. 17.
Figure 20:
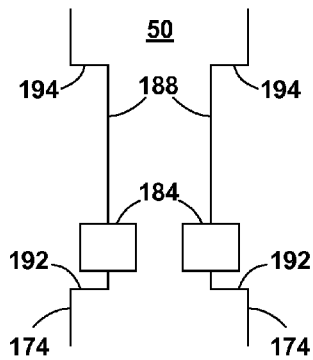
FIG. 20 is a detail of the shunt shorting fingers and notches of the contact of FIG. 17.

The present invention is a compliant electrical contact 10 and an assembly 12 employing a plurality of the contacts 10 that provides an interface between two electrical devices 2, 4, typically an integrated circuit (IC) and a printed circuit board (PCB) or pair of PCBs. As shown in FIG. 1, the assembly 12 with the contacts 10 is sandwiched between the electrical devices 2, 4 by a compression force 14 in a direction of compression 16. The compression force 14 may come from one direction only or from opposite directions simultaneously. The mechanism that produces the compression force may not compress the electrical devices 2, 4 and assembly 12 together linearly.

The contact 10 of the present invention has several embodiments, all of which include a convoluted spring 20 with a longitudinal axis 28 and convolutions 22. The convolutions 22 can have a constant length and cross-section or the convolutions 22 can have a length that varies and/or a cross-section that varies as, for example, in a further flattened or flat pyramidal shaped cross-section. The convolutions 22 may be continuous, as in FIG. 2, or discontinuous, as in FIG. 25.

The contact 10 has two contact points 24a, 24b (collectively, 24), one at each end, that make electrical contact with the conduction points 6 of the electrical devices 2, 4. The contact points 24 may come in many different end configurations known in the art. For example, most of the figures show contact points 24 that are the rounded corner of a single thickness of material. Another example is a rolled over forged end that is two thicknesses of material. In another example, the contact point 24 is a solder ball which can be permanently fixed to the contact points 24, thus ensuring a quality electrical connection to the PCB after the contact has be soldered to the PCB. The present invention contemplates any end configuration that is adequate for the desired application.

As described above, the contact 10 provides a temporary electrical connection between the conduction points 6 of two electrical devices 2, 4. In order to provide a good electrical connection, the contact 10 is compressed by application of the compression force 14 so that the spring force of the contact 10 pushes the contact points 24 of the contact 10 against the electrical device conduction points 6. The compliance of the convolutions 22 provide the necessary feature of adjusting for the noncoplanarities of the conduction points 6 of the electrical devices.

The contact 10 of the present invention has a shunt 50 that is generally parallel to the spring 20 and that spans the convolutions 22 longitudinally. The shunt 50 has three basic embodiments, an embodiment with a single shunt strip 90 that is attached near a contact point 24a, shown in FIGS. 2-16, an embodiment with a single shunt strip 92 that is attached at the center, shown in FIGS. 17-28, and an embodiment with two shunt strips 94, 96 attached near the contact points 24a, 24b, shown in FIGS. 29-48.

The contact 10 is produced by stamping or otherwise forming a length or sheet of electrically conductive material. The material for the spring 20 can be any electrically conductive material which has inherent elastic properties, for example, stainless steel, beryllium copper, copper, brass, nickel-chromium alloy, and palladium-rare metal alloys, such as PALINEY 7®, an alloy of 35% palladium, 30% silver, 14% copper, 10% gold, 10% platinum, and 1% zinc. The shunt 50 can be any material that is electrically conductive. All of these materials can be used in varying degrees of temper from annealed to fully hardened.

The single shunt strip embodiment with the shunt strip 90 attached near one contact point 24a is shown in FIGS. 2-16. The present invention contemplates any manner of attachment of the shunt strip 90 and the spring 20. In one manner, shown in FIGS. 2-4, the contact 10 is stamped as a single piece and bent 180° near the contact point 24a, as at 72, so that the shunt strip 90 and spring 20 are parallel. In another, shown in FIG. 7, the shunt strip 90 and spring 20 are stamped as two separate components with abutting, interlocking projections 74, 76 that are later attached together. The attachment can take any suitable form, including soldering, brazing, welding, adhesive, etc. When the spring 20 and shunt strip 90 are stamped separately, they can be made of the same material or the spring 20 can be made of a more elastic material while the shunt strip 90 can be made of a more electrically-conductive material.

The present invention contemplates that, for any of the disclosed embodiments, the spring 20 and shunt 50 can be different thicknesses. It is possible to make them different thicknesses when formed as a single piece and folded, but it is simpler when the spring 20 and shunt 50 are formed separately and then attached.

In the single shunt strip embodiment of FIGS. 2-6 and 8-16, the shunt strip 90 spans most or all of the convolutions, leaving a space 52 that the shunt strip 90 does not span. The space 52 leaves room for the shunt strip 90 so that it does not extend beyond the other contact point 24*b* at full compression, thereby allowing the contact 10 to compress fully without interfering with the contact point 24*b*. It is also contemplated that there may be a shunt strip 90 on either side of one of contact points 24*a*, 24*b*.

The shunt strip 90 electrically shorts the contact 10 adjacent to the two contact points 24*a*, 24*b*, bypassing the convolutions 22. A pair of protrusions 60 extend from the spring 20 or shunt strip 90. The protrusions 60 can be any form that extends from the plane of the spring 20 or shunt strip 90. A non-exhaustive list includes a 90° bend in the edge of the spring 20 or shunt strip 90, as in FIGS. 8-12, a 180° hook in the edge of the spring 20 or shunt strip 90, as in FIGS. 2-7, a bend or hook 60 stamped from the interior of the spring 20 or shunt strip 90, as in FIGS. 13-16, bent in either direction, as in FIG. 16, and a dimple stamped into the spring 20 or shunt strip 90.

The protrusions 60 provide a sliding electrical contact between the shunt strip 90 and the spring 20. The hook protrusions 60 of FIGS. 2-6 and 13-16 hold the shunt strip 90 against the spring 20 to make sure that contact between the shunt strip 90 and the spring 20 is maintained and to impart some rigidity to the contact 10. The shunt strip 90 and/or the spring 20 can be pre-bent so as to provide biasing force between the spring 20 and the shunt strip 90.

The height 68 of the protrusions 60 may be short, as in FIG. 6, or long to cover a greater length of the shunt strip 90. The width 70 of the protrusions 60 may be short, as in FIG. 5, or long to cover a larger width of the shunt strip 90.

The difference between to the three configurations is where the protrusions 60 contact the shunt strip 90. In the configuration of FIGS. 2-7, the outer edges 58 of the shunt strip 90 have a pair of longitudinal, elongated, parallel open slots 62 around which the protrusions 60 bend. In the configuration of FIGS. 8-12, the shunt strip 90 has a pair of longitudinal, elongated, parallel slots 64 near the outer edges 58. The protrusions 60 extend through the slots 64 from the spring 20. In the configuration of FIGS. 13-16, the shunt strip 90 has a single longitudinal, elongated slot 66 at or near the center. The protrusion 60 extends through the slot 66 from the spring 20. FIGS. 8-12 and 13-16 show two slots 64 and one slot 66, respectively, but there may be any number.

The lower end 80 of the slots 62, 64, 66 relative to the lower contact point 24*b* can be used to set any preloading of the contact 10, where preloading means that the contact 10 cannot fully extend and is in slight compression prior to being compressed during use. During manufacture, after the shunt strip 90 is bent parallel to the spring 20, the protrusions 60 are not aligned with the slots 62, 64, 66. In order to align the protrusions 60 with the slots 62, 64, 66, the spring 20 must be compressed. While the spring 20 is compressed, the protrusions 60 are bent or otherwise inserted into the slots 62, 64, 66. When the compression force is released, the spring 20 cannot fully extend because the protrusions 60 abut the lower end 80 of the slots 62, 64, 66.

The length of the slots 62, 64, 66 can also be used to limit the maximum compression of the contact 10. As the contact 10 is compressed, the protrusions 60 slide up the slots 62, 64, 66, eventually reaching the upper end 82. At this point, the contact 10 can compress no more. So the location of the upper end 82 of the slots 62, 64 set the maximum compression.

The second embodiment of the contact 10 of the present invention, shown in FIGS. 17-28, employs a single shunt strip 92 attached at the center of the spring 20. The spring 20, rather than having continuous convolutions 22, has a break 26 in the center. The shunt strip 92 is attached to the spring 20 at the break 26, as at 176, so that the shunt strip 92 does not move relative to the center of the spring 20. Any method of attachment is contemplated by the present invention including, but not limited to, soldering, welding, adhesive, rivet, etc. In the illustrated example, attachment fingers 178 extend from the shunt strip 92 and bend tightly around the spring 20. FIG. 13 shows four attachment fingers 178 but there may be any number two or more.

Optionally, each finger 178 is bent around an open slot 180 in the side 174 of the spring 20. The slot 180 facilitates keeping the shunt strip 92 from moving relative to the spring 20. If the shunt strip 92 should move, the attachment finger 178 hits an end of the slot 180, preventing further movement. Alternatively, the attachment fingers 178 are on the spring 20 and are bent around the shunt strip 92. Alternatively, there are one or more attachment fingers extending from the shunt strip 92 through a closed slot(s) in the spring 20 or one or two attachment fingers extending from the spring 20 through a closed slot(s) in the shunt strip 92, similarly to the configuration of FIGS. 13-16. The slot(s) is short enough to facilitate keeping the shunt strip 92 from moving relative to the spring 20.

The shunt strip 92 spans most or all of the convolutions, leaving spaces 170, 172 at each end that the shunt strip 92 does not span. The spaces 170, 172 leave room for the shunt strip 92 so that it does not extend beyond the contact points 24*a*, 24*b* at full compression, thereby allowing the contact 10 to compress fully. The two spaces 170, 172 do not have to be the same length.

The shunt strip 92 electrically shorts the contact 10 adjacent to the two contact points 24*a*, 24*b*, bypassing the convolutions 22. To this end, a pair of shorting fingers 184, 186 extend from the shunt strip 92 at each end and bend around the spring 20 for form a sliding attachment. The shorting fingers 184, 186 are bent loosely enough so that they provide a sliding electrical contact between the shunt strip 92 and the spring 20. The shorting fingers 184, 186 also hold the shunt strip 92 against the spring 20 to make sure that contact between the shunt strip 92 and the spring 20 is maintained and to impart some rigidity to the contact 10. The shunt strip 92 and/or the spring 20 may be bent slightly to ensure biasing and thus electrical contact between the shunt strip 92 and the spring 20.

Optionally, fingers 182 extend from the ends of the shunt strip 92. The fingers 182 are bent toward the spring 20, thereby providing better electrical contact between the shunt strip 92 and the spring 20. The bend is on the order of from 0° to 5°. Alternatively, the fingers extend from the spring 20 to the shunt strip 92 rather than from the shunt strip 92 to the spring 20.

Optionally, the spring 20 has a pair of elongated open slots 188, 190 on the sides 174 of the spring 20 corresponding to each pair of shorting fingers 184, 186 around which the shorting fingers 184, 186 bend approximately 180°. The inner end 192 of the slots 188, 190 can be used to set any preloading of the contact 10. During manufacture, after the shunt strip 92 is attached to the spring 20 with the attachment fingers 178, the shorting fingers 184, 186 are not aligned with the slots 188, 190. In order to align the shorting fingers 184, 186 with the slots 188, 190, the spring 20 must be compressed. While the spring 20 is compressed, the shorting fingers 184, 186 are bent around the slots 188, 190. When the compression force is released, the spring 20 cannot fully extend because the shorting fingers 184, 186 abut the inner end 192 of the slots 188, 190.

The length of the slots 188, 190 can also be used to limit the maximum compression of the contact 10. As the contact 10 is compressed, the shorting fingers 184, 186 slide up the slots 188, 190, eventually reaching the outer end 194. At this point, the contact 10 can compress no more. So the location of the outer end 194 of the slots 188, 190 sets the maximum compression.

Alternatively, the shorting fingers 184, 186 extend from the spring 20 and bend around the shunt strip 92. The optional slots 188, 190 are on the shunt strip 92.

Alternatively, the shorting fingers extend from the center of the shunt strip 92 through a slot(s) in the spring 20 or one or two fingers extend from the center of the spring 20 through a slot(s) in the shunt strip 92, similarly to the configurations of FIGS. 8-16.

Alternatively, the side edges 204 of the shunt 92 are bent longitudinally to form a U-shaped channel 202 for the spring 20, as in FIGS. 21-24. The central portion 206 of the channel 202 is sized for a slip fit with the spring 20. The outer portions 208 of the channel 202 are sized for a loose fit with the spring 20 so that the spring 20 can compress without being hindered by the shunt 92. The channel shape is but one possible version of this embodiment. Alternatively, the edges 204 can be bent completely around the spring section 20, thus completely encasing the spring section. Also, the edges 204 can be made as an interference fit with the plastic housing in which the contact is assembled. The edges 204 prevent any foreign object from obstructing the path of movement of the spring section 20.

Figure 25:
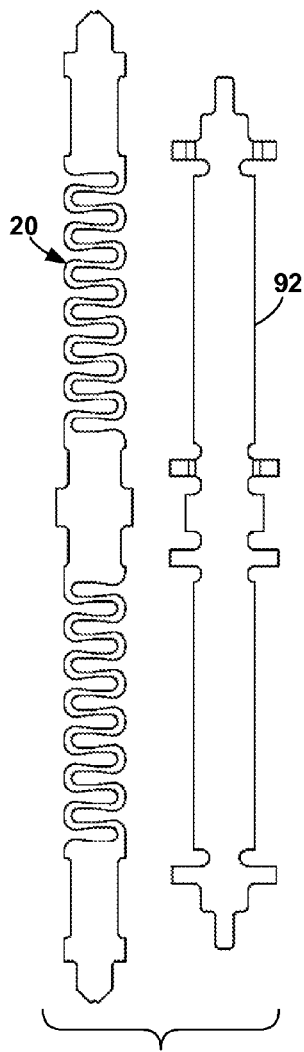
FIG. 25 is a plan view of the two-piece configuration of the contact of FIG. 17 prior to assembly.
Figure 26:
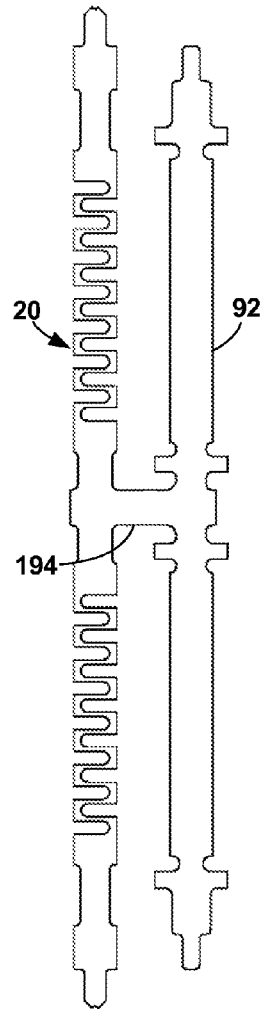
FIG. 26 is a plan view of the single piece configuration of the contact of FIG. 17 prior to folding.
Figure 27:
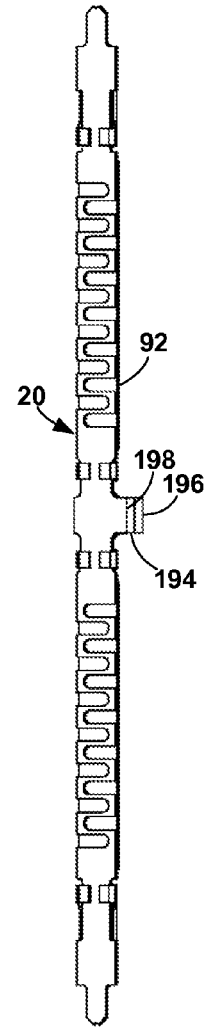
FIG. 27 is a plan view of the contact of FIG. 17 after folding and before trimming.
Figure 28:
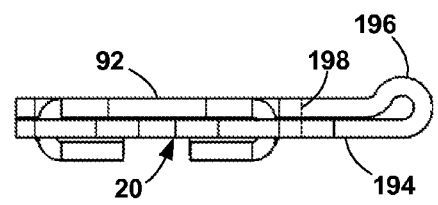
FIG. 28 is a top view of the contact of FIG. 17 after folding and before trimming.
Figure 33:
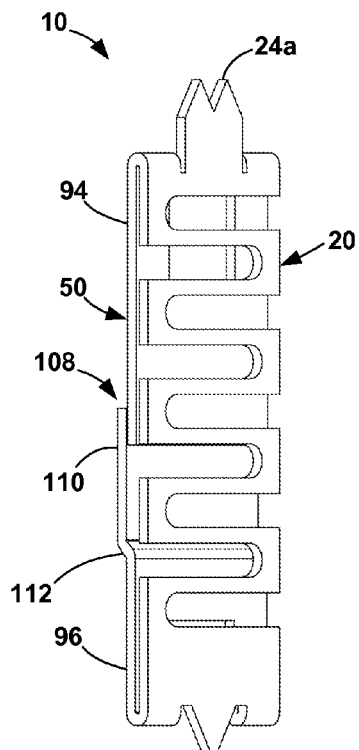
FIG. 33 is a front isometric view of another configuration of the double shunt strip embodiment of the contact of the present invention.
Figure 34:
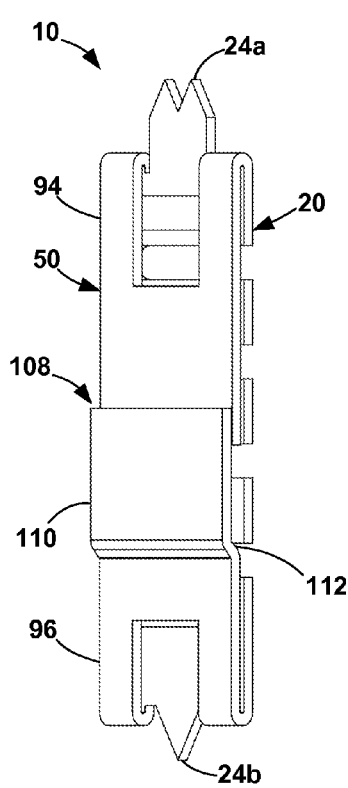
FIG. 34 is a back isometric of the contact of FIG. 33.
Figure 35:
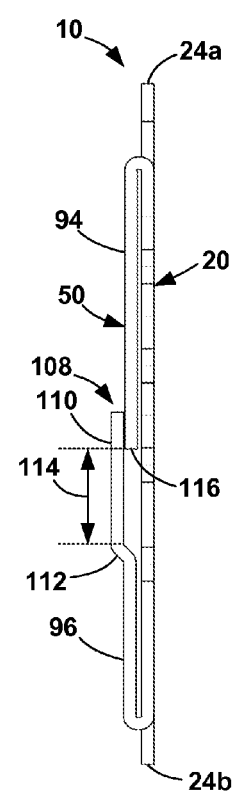
FIG. 35 is a side view of the contact of FIG. 33.
Figure 36:
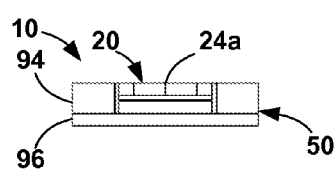
FIG. 36 is a top view of the contact of FIG. 33.
Figure 41:
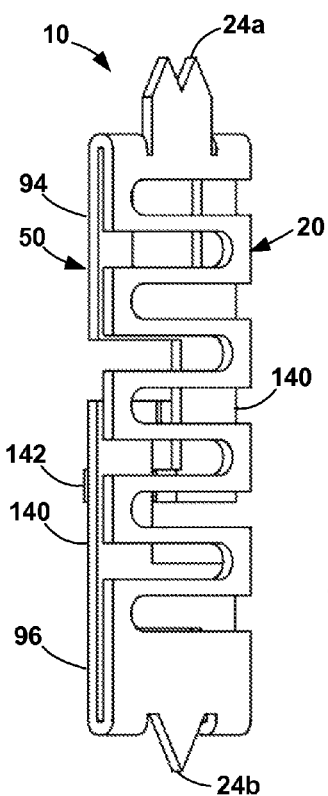
FIG. 41 is a front isometric view of another configuration of the double shunt strip embodiment of the contact of the present invention.
Figure 42:
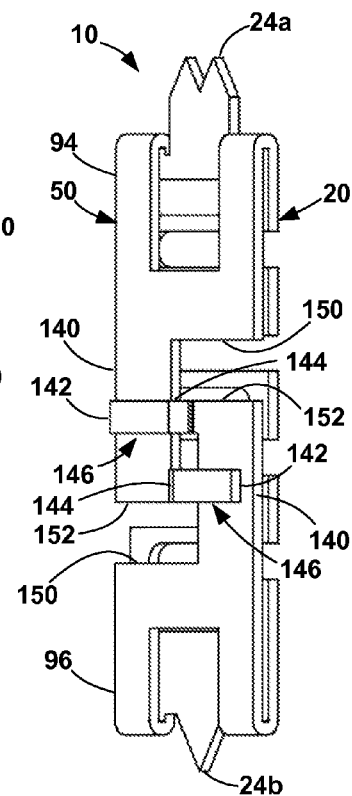
FIG. 42 is a back isometric of the contact of FIG. 41.
Figure 43:
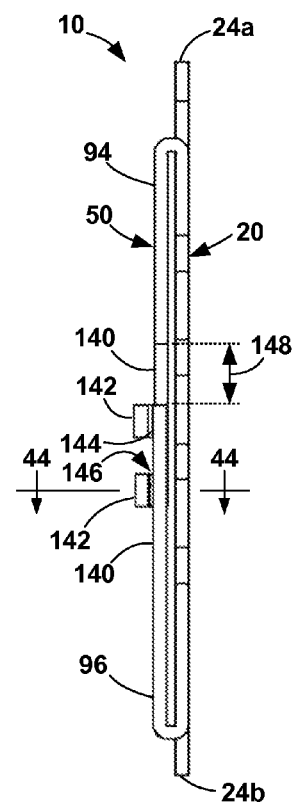
FIG. 43 is a side view of the contact of FIG. 41.
Figure 44:
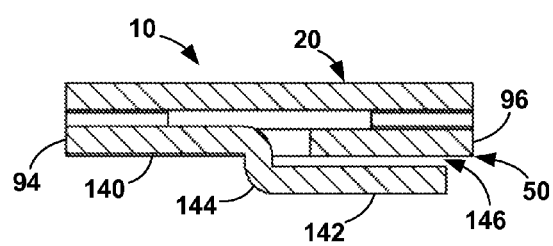
FIG. 44 is a cross-sectional view of the contact of FIG. 43 taken along the line 43-43.
Figure 45:
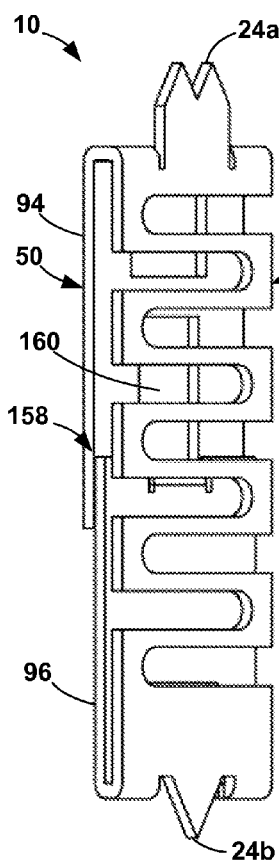
FIG. 45 is a front isometric view of another configuration of the double shunt strip embodiment of the contact of the present invention.
Figure 46:
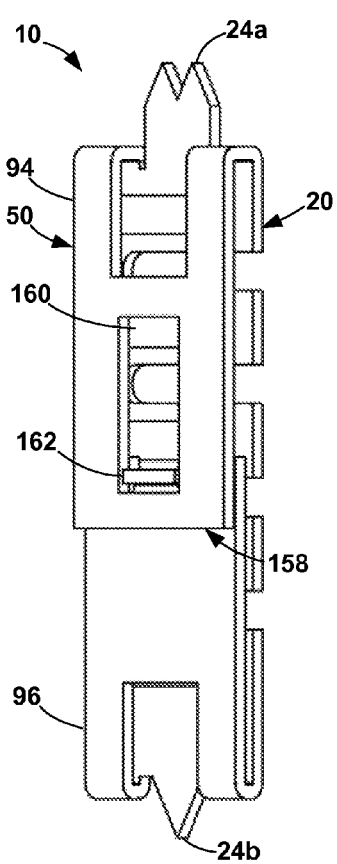
FIG. 46 is a back isometric of the contact of FIG. 45.
Figure 47:
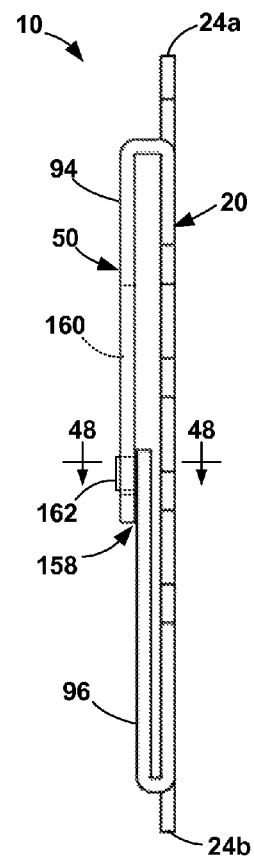
FIG. 47 is a side view of the contact of FIG. 45.
Figure 48:
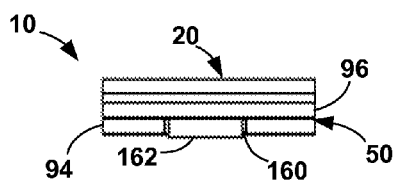
FIG. 48 is a cross-sectional view of the contact of FIG. 47 taken along the line 48-48.

The present invention contemplates that the second embodiment can be manufacturing in several different ways. One way is that that spring 20 and shunt strip 92 are formed separately, as shown in FIG. 25, and then attached as described above. Another way is shown in FIGS. 26-28. The entire contact is formed as a unit, shown in FIG. 26, with the spring 20 and shunt strip 92 connected by a bridge 194. The bridge 194 is folded, as at 196 in FIGS. 27 and 28, so that the spring 20 and shunt strip 92 are parallel and then the spring 20 and shunt strip 92 are attached as described above. After attachment, the bridge 194 is trimmed at a line 198 near the spring 20 and shunt strip 92.

The third embodiment of the contact 10 of the present invention employs two shunt strips 94, 96 in a number of different configurations. One shunt strip 94 is attached at or near one contact point 24a and the other shunt strip 96 is attached at or near the other contact point 24b. The present invention contemplates any manner of attachment of the shunt strips 94, 96 and the spring 20, including those described above with reference to the first embodiment. As with the other embodiments, when the spring 20 and shunt strips 94, 96 are stamped separately, they can be made of the same material or the spring 20 can be made of a more elastic material while the shunt strips 94, 96 can be made of a more electrically-conductive material.

In a first configuration, shown in FIGS. 29-32, the spring 20, rather than having continuous convolutions 22, has a break 26 in the center. The two shunt strips 94, 96 extend toward each other, leaving a gap 100 between them. The maximum compression is dictated by the length of the gap 100. As the contact 10 compresses, the ends 104 of the shunt strips 94, 96 close together. When the two ends 104 touch, the contact 10 is at full compression.

The sides of the spring 20 extend around the shunt strips 94, 96, as at 102, to provide a sliding electrical contact between the shunt strips 94, 96 and the spring 20. The bent sides 102 hold the shunt strips 94, 96 against the spring 20 to make sure that contact between the shunt strips 94, 96 and the spring 20 is maintained and to impart some rigidity to the contact 10.

A second configuration is shown in FIGS. 33-36. The two shunt strips 94, 96 overlap, as at 108. The end section 110 of one of the shunt strips 96 has an S bend 112 that results in the end section 110 overlapping the other shunt strip 94 to provide a sliding electrical contact between the shunt strips 94, 96. The length of the gap 114 between the bend 112 and the end 116 of the other shunt strip 94 dictates the maximum compression of the contact 10.

A third configuration is shown in FIGS. 37-40. The two shunt strips 94, 96 are split longitudinally, as at 120. One split section 122 has an S bend 126 inwardly toward the spring 20 and the other split section 124 has an S bend 128 outwardly away from the spring 20. Opposite inward and outward sections 122, 124 overlap, as at 130, to provide a sliding electrical contact between the shunt strips 94, 96. The length of the shortest gap 132 between a bend 126 and the end 134 of the other shunt strip 94 can dictate the maximum compression of the contact 10.

A fourth configuration is shown in FIGS. 41-44. The end section 140 of each shunt strip 94, 96 has a width less than half the contact width, forming a shoulder 150. Each end section 140 extends beyond the other end section 140. Extending 90° from the end of each end section 140 toward the other end section 140 is a tab 142 formed by an S bend 144. The tab 142 overlays the other end section 140 to provide a sliding electrical contact between the shunt strips 94, 96. The length of the gap 148 between the shoulder 150 of one shunt strip 94 and the end 152 of the other shunt strip 96 can dictate the maximum compression of the contact 10.

A fifth configuration is shown in FIGS. 45-48. The two shunt strips 94, 96 overlap, as at 158. One shunt strip 94 has a wide, longitudinal slot 160 and the other shunt strip 96 has a 90° protrusion 162 that extends into the slot to provide a sliding electrical contact between the shunt strips 94, 96. The length of the slot 160 dictates the maximum length(preload) and maximum compression of the contact 10.

Figure 49:
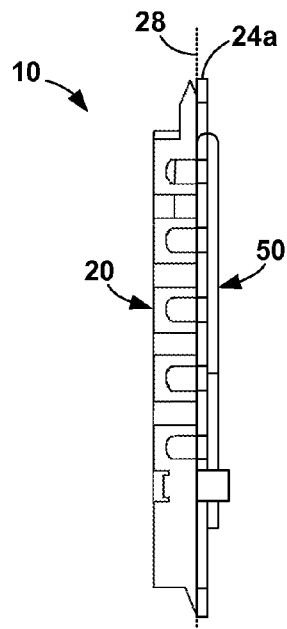
FIG. 49 is a front view of a configuration of the appendage embodiment of the contact of the present invention bent at 90°.
Figure 50:
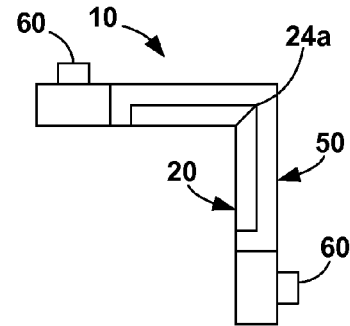
FIG. 50 is a top view of the contact of FIG. 49.
Figure 51:
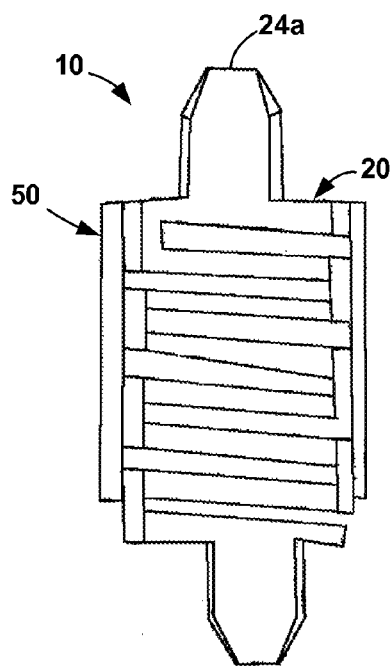
FIG. 51 is a front view of a configuration of the shunt embodiment of the contact of the present invention curved over 90°.
Figure 52:
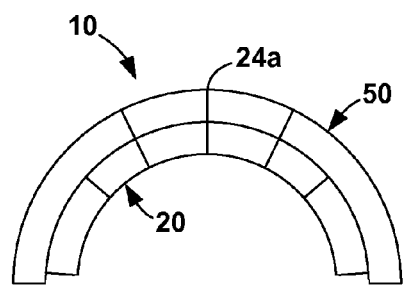
FIG. 52 is a top view of the contact of FIG. 51.
Figure 53:
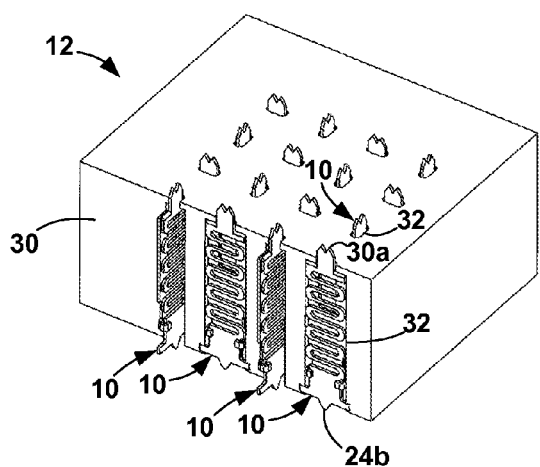
FIG. 53 is an isometric, cutaway view of an assembly of the present invention employing contacts of FIG. 2 installed in alternating orthogonal orientations.
Figure 54:
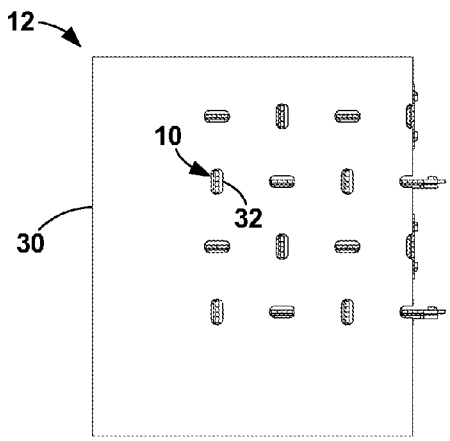
FIG. 54 is a top view of a section of the assembly of FIG. 53.

The present specification describes and shows the contact 10 as flat when viewed from a contact point 24. However, the present invention contemplates that the contact 10 can have other shapes. For example, FIGS. 49 and 50 show a contact 10 that is bent at a 90° on the longitudinal axis 28. FIGS. 51 and 52 show a contact 10 that is bent in a semicircular curve, resulting in a contact 10 that is semicylindrical. These are merely examples and other angles and curves can be implemented.

Figure 55:
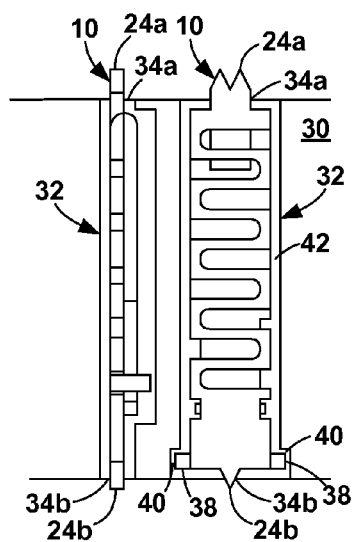
FIG. 55 is an enlarged, cross-sectional, side view of a section of the assembly of FIG. 53.
Figure 56:
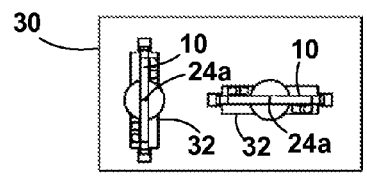
FIG. 56 is an enlarged, bottom view of a section of the assembly of FIG. 53.

As shown in FIG. 1, the contact 10 is used in an assembly 12 that provides temporary electrical connections to conduction points 6 between the two electrical devices 2, 4. In general, as shown in FIG. 55, the contact 10 is placed within a through aperture 32 in a dielectric panel 30. The aperture 32 has a cavity 42 with openings 34a, 34b at both ends. The bulk of the contact 10 resides in the cavity 42 and the contact points 24 protrude through the openings 34a, 34b.

Figure 57:
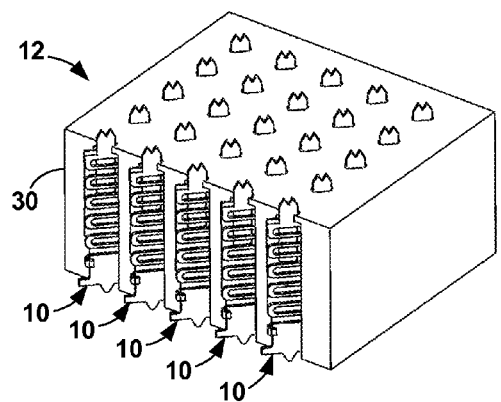
FIG. 57 is an isometric, cutaway view of an assembly of the present invention employing contacts of FIG. 2 installed parallel to each other.
Figure 58:
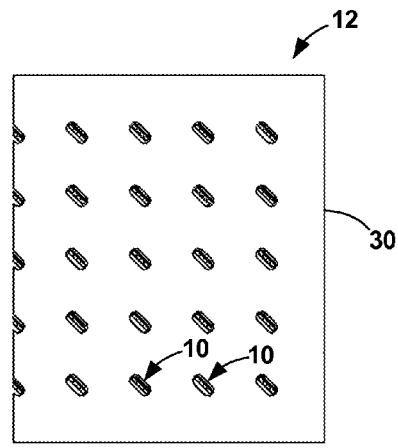
FIG. 58 is a top view of a section of the assembly of FIG. 57.

The assembly 12 of FIGS. 53-56 shows a configuration where adjacent contacts 10 are oriented at right angles to each other. The assembly 12 of FIGS. 57 and 58 show a configuration where all of the contacts 10 are oriented in the same direction. The present invention contemplates that the contacts 10 may be at any orientation relative to each other. Changing the orientation of the contacts 10 can lower the electrical parasitic values of the connection.

When a compression force 14 is applied in the compression direction 16 to the contact points 24 protruding through the openings of the dielectric panel 30, the aperture 32 maintains the position of the contact 10 as the compression force 14 is applied.

The contact 10 can be made extremely small by employing an extremely thin material and forming apertures 32 in the dielectric panel 30 for connecting electrical devices 2, 4 with pitches smaller than 0.5 mm.

Figure 59:
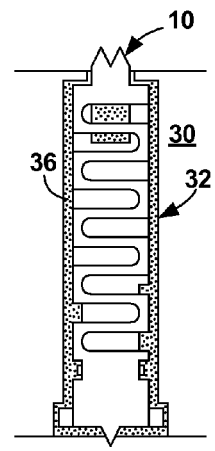
FIG. 59 is an enlarged, cross-sectional, side view of a section of the assembly of FIG. 53 showing the aperture filled with an elastomer.

Optionally, the space within the contact apertures 42 remaining after the contact 10 is installed is filled with a compliant, electrically conductive elastomer 36, as shown in FIG. 59. The elastomer 36 can perform three functions. It adds to the resiliency of the contact 10, meaning that the contact 10 can tolerate more operational cycles than without the elastomer 36. The elastomer 36 can aid in electrically shorting the convolutions 22, thus potentially minimizing the electrical parasitic values of the contact 10. The elastomer 36 can also act as a retention method for holding the contact 10 in the aperture 32.

The contact 10 is secured in the aperture 32 by any adequate means. In one example, as previously mentioned, the elastomer 36 may aid in retention. In another example, the contact 10 may have bosses which attach the contact 10 to a bandoleer (not shown) until installation. Once the contact 10 is sheared from bandoleer, the remaining stubs 38 can be used for retention. As shown in FIG. 55, the stubs 38 can slide into slots 40 in the cavity 42 that are longitudinal to the contact 10 such that the contact 10 can float within the aperture 32, thus ensuring the same contact force on the electrical devices 2, 4. The ends of the slots 40 may be swaged over so the contact 10 is retained within the aperture 32. Alternatively, the slots 40 may be narrower than the stubs 38 and the stubs 38 are pressed into the slots 40 for a friction or interference fit. In this case, the bottom contact point is not compliant, that is, it will not move relative to the dielectric panel 30.

Figure 60:
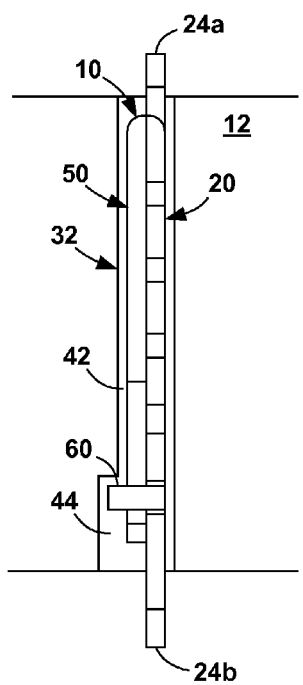
FIG. 60 is a cross-sectional, side view showing an alternate method of contact retention.

In another method of retention, shown in FIG. 60, the hooks 60 can slide into slots 44 in the cavity 42 that are longitudinal to the contact 10 such that the contact 10 can float within the aperture 32, thus ensuring the same contact force on the electrical devices 2, 4.

The hooks 60 provide thickness to the contact 10. The cavity 42 must accommodate the hooks 60 resulting in a larger cavity that facilitates proper operation of the contact 10.

Thus it has been shown and described a compliant electrical contact and assembly. Since certain changes may be made in the present disclosure without departing from the scope of the present invention, it is intended that all matter described in the foregoing specification and shown in the accompanying drawings be interpreted as illustrative and not in a limiting sense.

What is claimed is:

1. A compliant electrical contact adapted to be compressed through a compression range, said contact comprising:
    (a) a spring comprised of an electrically conductive, inherently elastic material, and having a longitudinal axis, a plurality of convolutions in two sections with a break therebetween, a first spring end, and a second spring end;
    (b) a first contact point at said first spring end;
    (c) a second contact point at said second spring end; and
    (d) a shunt comprised of an electrically conductive material and having a center, a first end, and a second end, said shunt extending parallel to said spring longitudinal axis, said shunt center electrically attached to said spring at said break by a fixed attachment, said first shunt end attached to said spring by a first sliding attachment adjacent to said first contact point, said second shunt end attached to said spring by a second sliding attachment adjacent to said second contact point, each of said sliding attachments including at least a shorting finger with a bend for maintaining electrical contact between said spring and said shunt.

2. The compliant electrical contact of claim 1 wherein said shunt and said spring are composed of different materials.

3. The compliant electrical contact of claim 1 wherein said sliding attachment includes a pair of shorting fingers bent between approximately 90° and approximately 180° around a corresponding open slot.

4. The compliant electrical contact of claim 3 wherein said open slots are designed to preload said contact.

5. The compliant electrical contact of claim 3 wherein said open slots are designed to limit compression of said contact.

6. The compliant electrical contact of claim 3 wherein said shorting fingers extend from said shunt around said open slots on the sides of said spring.

7. The compliant electrical contact of claim 3 wherein said shorting fingers extend from said spring around said open slots on the sides of said shunt.

8. The compliant electrical contact of claim 1 wherein said sliding attachment includes at least one shorting finger extending through a corresponding slot.

9. The compliant electrical contact of claim 8 wherein said slot is designed to preload said contact.

10. The compliant electrical contact of claim 8 wherein said slot is designed to limit compression of said contact.

11. The compliant electrical contact of claim 8 wherein said at least one shorting finger extends from said shunt through said slot in said spring.

12. The compliant electrical contact of claim 8 wherein said at least one shorting finger extends from said spring through said slot in said shunt.

13. The compliant electrical contact of claim 1 wherein said fixed attachment includes a pair of attachment fingers bent between approximately 90° and approximately 180° around a corresponding open slot.

14. The compliant electrical contact of claim 13 wherein said attachment fingers extend from said shunt around said open slots on the sides of said spring.

15. The compliant electrical contact of claim 13 wherein said attachment fingers extend from said spring around said open slots on the sides of said shunt.

16. The compliant electrical contact of claim 1 wherein said fixed attachment includes at least one attachment finger extending through a corresponding slot.

17. The compliant electrical contact of claim 16 wherein said attachment finger extends from said shunt through said slot in said spring.

18. The compliant electrical contact of claim 16 wherein said attachment finger extends from said spring through said slot in said shunt.

19. The compliant electrical contact of claim 1 wherein the side edges of said shunt are bent longitudinally to form a channel for said spring.

20. The compliant electrical contact of claim 1 wherein said contact is generally flat.

* * * * *